(12) United States Patent
Moriya et al.

(10) Patent No.: US 6,797,093 B2
(45) Date of Patent: Sep. 28, 2004

(54) GLASS CERAMIC MULTILAYER SUBSTRATE MANUFACTURING METHOD AND GLASS CERAMIC MULTILAYER SUBSTRATE PRODUCT

(75) Inventors: Yoichi Moriya, Omihachiman (JP); Yasutaka Sugimoto, Kyoto (JP); Osamu Chikagawa, Shiga-ken (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 58 days.

(21) Appl. No.: 10/161,599

(22) Filed: Jun. 5, 2002

(65) Prior Publication Data

US 2002/0189742 A1 Dec. 19, 2002

(30) Foreign Application Priority Data

Jun. 5, 2001 (JP) ........................................ 2001-169108

(51) Int. Cl.[7] .............................. B32B 31/26; H05K 3/46
(52) U.S. Cl. .................................. 156/89.12; 156/89.16
(58) Field of Search ........................... 156/89.12, 89.16; 428/210, 901

(56) References Cited

U.S. PATENT DOCUMENTS

| | | | | |
|---|---|---|---|---|
| 5,102,720 A | * | 4/1992 | Raj ............................... | 428/209 |
| 5,147,484 A | * | 9/1992 | Chance et al. ............ | 156/89.15 |
| 5,474,741 A | * | 12/1995 | Mikeska et al. .......... | 427/376.7 |
| 5,866,240 A | * | 2/1999 | Prabhu et al. .............. | 428/210 |
| 6,337,123 B1 | * | 1/2002 | Ryugo et al. ................ | 428/210 |
| 6,579,392 B1 | * | 6/2003 | Kameda et al. ........... | 156/89.11 |
| 6,582,541 B2 | * | 6/2003 | Nishide et al. ........... | 156/89.12 |
| 6,602,616 B2 | * | 8/2003 | Sugimoto et al. ........... | 428/688 |

FOREIGN PATENT DOCUMENTS

| | | | |
|---|---|---|---|
| JP | 04-010591 | | 1/1992 |
| JP | 04-243978 | | 9/1992 |
| JP | 4-369509 | * | 12/1992 |
| JP | 06-097656 | | 4/1994 |
| JP | 06-172017 | | 6/1994 |
| JP | 09-312476 | | 12/1997 |
| JP | 10-65336 | * | 3/1998 |
| JP | 10-308584 | * | 11/1998 |
| JP | 11-106265 | * | 4/1999 |
| WO | 00/04577 | * | 1/2000 |
| WO | 2000/04577 | * | 1/2000 |

* cited by examiner

Primary Examiner—Melvin C. Mayes
(74) Attorney, Agent, or Firm—Dickstein, Shapiro, Morin & Oshinsky, LLP (57) ABSTRACT

A glass ceramic multilayer substrate having a better flatness and a low sintering shrinkage ratio is made by sintering an unsintered laminated body formed by laminating together first and second green sheets capable of exhibiting different shrinking behaviors during a sintering process, thereby producing the desired glass ceramic multilayer substrate. When the shrinkage starting temperatures (°C.) of the first and second green sheets are TSa and TSb, the sintering process ending temperatures (°C.) of the first and second green sheets are TFa and TFb, and when the temperature rising speed is X° C./min, the respective parameters satisfy (TFa+3X)<TSb or (TFb+3X)<TSa.

18 Claims, 2 Drawing Sheets

GLASS CERAMIC MULTILAYER SUBSTRATE MANUFACTURING METHOD AND GLASS CERAMIC MULTILAYER SUBSTRATE PRODUCT

BACKGROUND OF THE INVENTION

1. Field of the Invention

The present invention relates to a method for manufacturing a glass ceramic multilayer substrate, and also relates to a glass ceramic multilayer substrate product obtained by using the manufacturing method. In detail, this invention relates to an improvement which can more reliably inhibit the undesired shrinkage that occurs in a sintering process for obtaining a glass ceramic multilayer substrate.

2. Description of the Related Art

When manufacturing a ceramic multilayer substrate having wiring conductors such as conductor film and via-hole conductor, the wiring conductors have to be subjected to sintering during the obtaining of the multilayer substrate. Accordingly, when a low resistance conductor such as Ag and Cu is used to form wiring conductors, the ceramic multilayer substrate has to be made of a material which can be sintered at a temperature equal to or lower than the melting point of Ag, Cu and the like. In order to meet such a requirement, a glass ceramic multilayer substrate has been put into actual use.

Usually, a glass ceramic multilayer substrate having wiring conductors formed by a low resistance conductor such as Ag, Cu may be manufactured in the following process. Namely, at first, a resin and a solvent are mixed into a powder mixture formed by a glass powder and a ceramic powder, so that a slurry is formed. This slurry is then formed into a plurality of sheets which can be used as green sheets. Subsequently, an electrically conductive paste containing an electrically conductive component which may be Ag or Cu is printed on the green sheets, thereby forming wiring conductors. Afterwards, a plurality of such green sheets each containing the wiring conductors are laminated one over another, thereby forming a laminated body which has not been sintered. Then, the laminated body is subjected to a sintering treatment, thereby obtaining the desired glass ceramic multilayer substrate.

However, the aforementioned sintering treatment has encountered the following problems. Namely, the shrinking behavior of the electrically conductive paste during the sintering process is different from that of the green sheets. Further, metal components contained in the electrically conductive paste will be dispersed into the glass material contained in the green sheets, and this will cause a change in the shrinking behavior of the glass material surrounding the wiring conductors. As a result, it is difficult to produce a glass ceramic multilayer substrate which is completely flat without any warpage.

Moreover, the sintering shrinkage of one glass ceramic multilayer substrate will not always be the same as that of another. This is because one batch of raw material can have a different quality from that of another, because the mixing ratio for making one group of green sheets can be different from the mixing ratio for making another group of green sheets, and further because the pressure for pressing one unsintered laminated body can be different from a pressure for pressing another unsintered laminated body. Under this circumstance, a conductor film formed on the outer surface of a glass ceramic multilayer substrate will often deviate from its correct position. As a result, the attachment size error will often go beyond an allowable range in a process where electronic parts are attached to a substrate in a manner as if flip chips are attached thereto, thus rendering it extremely difficult to ensure a high yield in an industrial production.

For this reason, it has long been demanded to provide an improved method for manufacturing an improved glass ceramic multilayer substrate, which method should satisfy the condition that when the sintering shrinkage in the plane direction of a glass ceramic multilayer substrate is small, and when its sintering process shrinking ratio (%) can be defined by the equation {(size before sintering)−(size after sintering)}×100/(size before sintering)}, the sintering process shrinking ratio is within 10%.

In order to meet the above requirement, Japanese Unexamined Patent Application Publication No. 4-243978 has suggested the following method for manufacturing an improved glass ceramic multilayer substrate. A plurality of green sheets each containing a glass powder and a ceramic powder as its solid components are laminated one above another to form an unsintered laminated body. Then, an arresting green sheet(s) containing as its solid component a ceramic powder which will not be sintered at a sintering temperature (this temperature is for sintering the unsintered laminated body) is/are laminated on one or both sides of the unsintered laminated body. If the sintering process is performed in such a state, it is possible to inhibit shrinkage in the plane direction of the laminated body, allowing a shrinkage only in the thickness direction, and thus producing a desired glass ceramic multilayer substrate having a high flatness. In this way, the above-described method makes it possible to manufacture a flat glass ceramic multilayer substrate.

However, the arresting green sheet(s) formed on one or both sides of the unsintered laminated body in the above-described method will have to be removed after the sintering process is over. Such green sheet(s) will not form part of the laminated product. Because of this, the total cost for manufacturing a glass ceramic multilayer substrate is high, since the entire manufacturing cost will include a cost for forming the arresting green sheet(s) and also a cost for removing the arresting green sheet(s).

In view of the above, one of the most noticeable techniques during the last several years was suggested in Japanese Unexamined Patent Application Publication Nos. 6-97656 and 6-172017. These patent publications disclose a method which involves a sintering process, but which employs first green sheets having a certain shrinking behavior and second green sheets having a different shrinking behavior from that of the first green sheets. According to this method, it is possible to inhibit shrinkage in the plane direction of the laminated body by sintering an unsintered laminated body formed by laminating these green sheets, thereby making it possible to produce a flat glass ceramic multilayer substrate.

The basic technical principles disclosed in the above patent publications may be stated as follows.

When a sintering process is first carried out at a relatively low temperature corresponding to a sintering temperature for sintering the first green sheets, the first green sheets will tend to shrink. However, since the sintering temperature at this time is lower than the sintering temperature for sintering the second green sheets, the second green sheets will be kept in an unsintered state, thus having almost no shrinkage. For this reason, the shrinkage in the plane direction of the first green sheets can be inhibited by an arresting action of the second green sheets. Then, once another sintering process is carried out at a relatively high temperature corresponding to a sintering temperature for sintering the second green sheets, the second green sheets will tend to shrink. At this time, the shrinkage in the plane direction of the second green sheets will be inhibited by an arresting action of the sintered first green sheets. In this way, the sintering shrinkage of the laminated body is greatly inhibited so that it occurs only in the thickness direction of the laminated body, with almost no shrinkage occurring in the plane direction thereof. As a result, it is possible to produce an improved glass ceramic multilayer substrate having a reduced shrinkage and an increased flatness.

However, the glass ceramic multilayer substrate manufacturing method disclosed in Japanese Unexamined Patent Application Publication Nos. 6-97656 and 6-172017 also has a problem that in carrying out the process disclosed in these patent publications, it will sometimes be difficult to sufficiently inhibit shrinkage in the plane direction of a laminated body during the sintering process, and it will also be occasionally difficult to ensure that a sintering shrinkage can be controlled within 10%. It is difficult to exactly produce an improved glass ceramic multilayer substrate having a sufficient flatness.

The above troubles are associated with the difference between a shrinkage ending temperature of one group of green sheets and the shrinkage starting temperature of the other group of green sheets, and also related to a temperature rising speed in the sintering process. Further, it has been found that the above troubles happen early if there is only a small difference between the shrinkage ending temperature of one group of green sheets and the shrinkage starting temperature of the other group of green sheets, and also if the temperature rising speed is high in the sintering process.

In order to avoid the above troubles, one may consider inhibiting shrinkage in the plane direction of a laminate body by providing a portion in the laminated body which is to be sintered at a predetermined temperature within an intermediate temperature range existing between the shrinkage ending temperature of one group of green sheets and the shrinkage starting temperature of the other group of green sheets, or by slowing down the temperature rising speed. However, this will require a longer operation time for completing the sintering treatment and thus not advisable in view of a increased costs.

SUMMARY OF THE INVENTION

Accordingly, it is an object of the present invention to provide an improved method for manufacturing a glass ceramic multilayer substrate, such that even if the temperature rising speed during sintering is increased, it is still possible to exactly inhibit shrinkage in the plane direction of a laminated body. It is another object of the present invention to provide an improved glass ceramic multilayer substrate obtained by using the method of the present invention.

The glass ceramic multilayer substrate manufacturing method according to the present invention comprises a step (hereinafter sometimes referred to as a first step) of preparing first green sheets each containing as its solid components, a first glass powder and a first ceramic powder; a step (hereinafter sometimes referred to as a second step) of preparing second green sheets each containing as its solid components, a second glass powder and a second ceramic powder and capable of exhibiting a sintering shrinkage different from that of the first green sheets; a step (hereinafter sometimes referred to as a third step) of forming conductor films and/or via-hole conductors in the first green sheets and/or the second green sheets; a step (hereinafter sometimes referred to as a fourth step) of forming an unsintered laminated body by laminating together at least one of the first green sheets and at least one of the second green sheets; and a step (hereinafter sometimes referred to as a fifth step) of sintering the laminated body. The method is characterized by the following aspects which are effective for solving the aforementioned problems peculiar to the above-described conventional methods.

After the unsintered laminated body has exceeded the lower one of the respective glass transition temperatures of the first and second glass powders in the fifth step in the method of the present invention, the unsintered laminated body is caused to reach the highest sintering temperature through a temperature rising process having a temperature rising speed of $X°$ C./min ($X>1$), thereby effecting a predetermined sintering treatment to occur with a predetermined sintering profile.

Further, if the shrinkage starting temperatures (° C.) of the first and second green sheets are TSa and TSb in the fifth step, and if the sintering process ending temperatures (° C.) (when a shrinkage is 90% of a predetermined shrinking amount) of the first and second green sheets are TFa and TFb, the conditions should be set to satisfy the following equation.

$$(TFa+3X)<TSb \text{ or } (TFb+3X)<TSa$$

Namely, the glass ceramic multilayer substrate manufacturing method according to the present invention is characterized in that conditions are set which satisfies the equation $(TFa+3X)<TSb$ or $(TFb+3X)<TSa$. In order to satisfy this condition, it is required to properly select the materials forming the first and second green sheets, or set an appropriate temperature rising speed. However, it is also possible that the above condition may be satisfied by designing proper materials for the first and second green sheets and at the same time setting an appropriate temperature rising speed.

When considering proper materials for the first and second green sheets in order to satisfy the above condition, another aspect of the present invention is to prepare the first and second green sheets using a method capable of rendering the prepared sheets to satisfy the above condition. For this purpose, the glass ceramic multilayer substrate manufacturing method according to the present invention is carried out by including the following preparation steps.

Namely, the glass ceramic multilayer substrate manufacturing method of the present invention, in accordance with its another aspect, comprises preparing first test green sheets each containing a first glass powder and a first ceramic powder as its solid components; preparing second test green sheets each containing as its solid components, a second glass powder and a second ceramic powder and capable of exhibiting a sintering shrinkage different from that of the first test green sheets; measuring the shrinking amounts of the first and second test green sheets, while at the same time sintering in accordance with a predetermined sintering profile so as to enable the green sheets to reach the highest temperature through a temperature rising process having a temperature rising speed of 1° C./min; seeking the shrinkage starting temperatures TSa (° C.) and TSb (° C.) of the sintering process, and also seeking the sintering process ending temperatures TFa (° C.) and TFb (° C.); and confirming whether or not the first and second test green sheets satisfy the equation $(TFa+3X)<TSb$ or $(TFb+3X)<TSa$.

The glass ceramic multilayer substrate manufacturing method of the present invention further comprises preparing first green sheets which are the same as the first test green sheets; preparing second green sheets which are the same as the second test green sheets; forming conductor films and/or via-hole conductors in the first green sheets and/or the second green sheets; and forming an unsintered laminated body by laminating at least one of the first green sheets and at least one of the second green sheets. After the unsintered laminated body has exceeded the lower one of the respective glass transition temperatures of the first and second glass powders, the unsintered laminated body is caused to reach the highest sintering temperature through a temperature rising process having a temperature rising speed of X° C./min (X>1), thereby effecting a desired sintering treatment in occurrence with a predetermined sintering profile.

It is preferable in the present invention that the thermal expansion difference between the first green sheets and the second green sheets is an average thermal expansion coefficient in a temperature range from 20° C. to the lower one of the respective glass transition temperatures of the first and second glass powders, and is preferable to be controlled within $\pm 0.5 \times 10^{-6}$/° C.

In order to ensure that the first green sheets exhibit a sintering shrinkage different from that of the second green sheets, it is required to satisfy at least one of the flowing three conditions. A first condition (A) is that the first glass powder has a composition different from that of the second glass powder. A second condition (B) is that the first ceramic powder has a composition different from that of the second ceramic powder. A third condition (C) is that the mixing ratio of the first glass powder to the first ceramic powder in the first green sheets is different from the mixing ratio of the second glass powder to the second ceramic powder in the second green sheets. If the third condition is satisfied, the first glass powder may have the same composition as the second glass powder, and the first ceramic powder may have the same composition as the second ceramic powder.

It is preferable in the above fourth step that one of the first and second green sheet groups are laminated to form an inner layer, and the other of the first and second green sheet groups are laminated to form outer layers, with each inner layer and each outer layer being formed by at least one green sheet.

As a preferred embodiment of the present invention, the first glass powder is BaO—MgO—SiO$_2$—B$_2$—O$_3$ glass, and the first ceramic powder is at least one of alumina, spinel and zirconia. The first green sheets are so formed that the mixing ratio of the first glass powder to the first ceramic powder is about 40:60 to 100:0 by weight. The first glass power may contain at least one substance selected from the group consisting of Al$_2$O$_3$, ZnO, TiO$_2$, ZrO$_2$ and R$_2$O (R is an alkali metal) as an additive. Moreover, each of the first green sheets may contain copper oxide.

Further, as a preferred embodiment of the present invention, the second glass powder is MgO—ZnO—SiO$_2$—B$_2$O$_3$ glass, and the second ceramic powder is BaO—Re$_2$O$_3$—Nd$_2$O$_3$—TiO$_2$ (Re is a rare earth element). The second green sheets are so formed that a mixing ratio of the second glass powder to the second ceramic powder is about 10:90 to 40:60 by weight. The second glass powder may contain as an additive at least one substance selected from the group consisting of BaO, CaO, Al$_2$O$_3$ and R$_2$O (R is an alkali metal). Moreover, each of the second green sheets may contain copper oxide.

According to the glass ceramic multilayer substrate manufacturing method of the present invention, when a sintering shrinkage ratio (%) is defined by the equation {(size before sintering)−(size after sintering)}×100/(size before sintering), the sintering shrinkage ratio of the laminated body at the fifth step is preferably within 10%.

In addition, the present invention is also directed to an improved glass ceramic multilayer substrate obtained by using the manufacturing method described above.

DESCRIPTION OF THE PREFERRED EMBODIMENTS

Figure 1A:
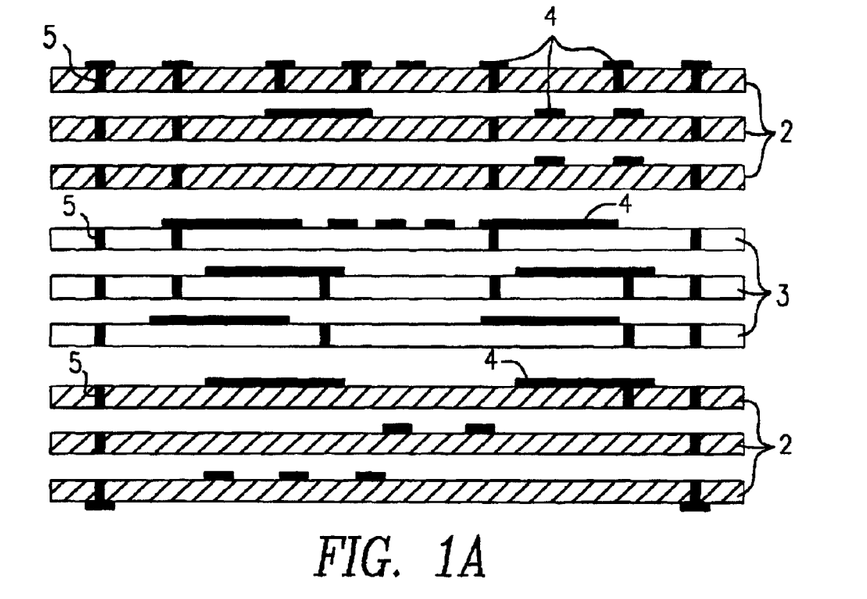
FIGS. 1A to 1C are cross sectional views successively illustrating several typical steps involved in the method for manufacturing a glass ceramic multilayer substrate, representing an embodiment of the present invention.
Figure 1B:
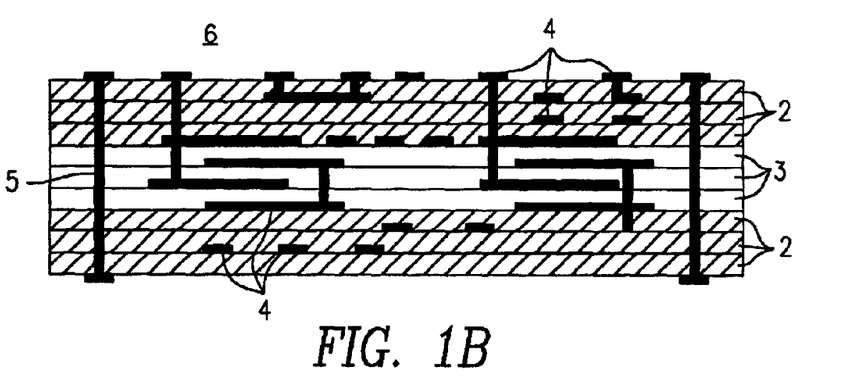
Figure 1C:
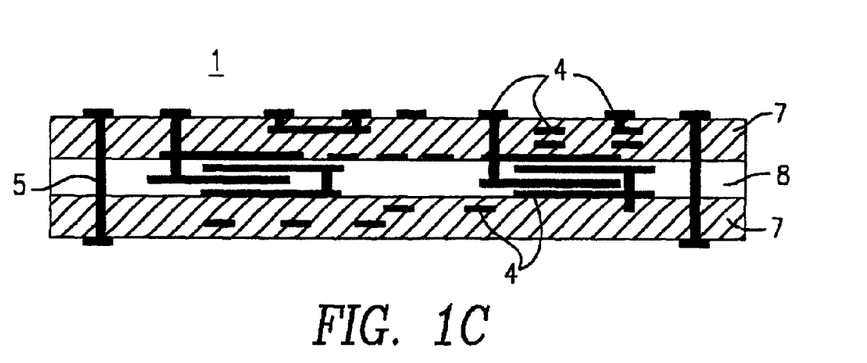

FIGS. 1A to 1C are used to explain the method for manufacturing a glass ceramic multilayer substrate representing an embodiment of the present invention. Using the method of the invention, it is possible to produce a glass ceramic multilayer substrate 1 shown in FIG. 1C, through steps shown in FIGS. 1A and 1B.

At first, two steps including a first step and a second step are carried out as shown in FIG. 1A. The first step is to prepare a plurality of first green sheets 2 each containing a first glass powder and a first ceramic powder as its solid components. The second step is to prepare a plurality of second green sheets 3 each containing a second glass powder and a second ceramic powder as its solid components.

The first green sheets 2 and the second green sheets 3 exhibit different sintering shrinkage behaviors. In more detail, the first green sheets and the second green sheets have different shrinkage starting temperatures and/or different sintering process ending temperatures.

In order to satisfy these conditions, the first glass power can be prepared to have a different composition from the second glass powder. Similarly, the first ceramic powder can be prepared to have different composition from the second ceramic powder. Further, the mixing ratio of the first glass powder to the first ceramic powder in the first green sheets 2 can be different from the mixing ratio of the second glass powder to the second ceramic powder in the second green sheets 3.

As the first glass powder contained in the first green sheets 2, one can use BaO—MgO—SiO$_2$—B$_2$O$_3$ glass powder. As the first ceramic powder contained in the first green sheets 2, at least one substance selected from the group consisting of alumina, spinel and zirconia can be used. Further, the first green sheets 2 are so formed that a mixing ratio of the first glass powder to the first ceramic powder is about 40:60 to 100:0 by weight. In addition, the first glass power may contain at least one substance selected from the group consisting of Al$_2$O$_3$, ZnO, TiO$_2$, ZrO$_2$ and R$_2$O (R is an alkali metal) as an additive. Moreover, each of the first green sheets 2 may contain copper oxide.

Further, it is possible to use MgO—ZnO—SiO$_2$—B$_2$O$_3$ glass powder as the second glass powder contained in the second green sheets 3. As the second ceramic powder, one can use BaO—Re$_2$O$_3$—Nd$_2$O$_3$—TiO$_2$ (Re is a rare earth element). The second green sheets are so formed that the mixing ratio of the second glass powder to the second ceramic powder is about 10:90 to 40:60 by weight. The second glass power is permitted to contain at least one substance selected from the group consisting of BaO, CaO, Al$_2$O$_3$ and R$_2$O (R is an alkali metal) as an additive. Moreover, each of the second green sheets 3 may contain copper oxide.

When preparing the first green sheets 2 and the second green sheets 3, the solid components including the glass powder and ceramic powder are dispersed in an organic vehicle consisting of an organic binder and an organic solvent, thereby forming a slurry. The slurry is then formed into a plurality of sheets by using the doctor blade method.

Then, as shown in FIG. 1A, the third step is carried out so that conductor films 4 and/or via-hole conductors 5 are formed in the first green sheets 2 and/or the second green sheets 3. In this embodiment, both the conductor films 4 and the via-hole conductors 5 are formed in both the first green sheets 2 and the second green sheets 3. The conductor films 4 and the via-hole conductors 5 may be formed in the first green sheets 2 and the second green sheets 3 by using an electrically conductive paste containing Ag as an electrically conductive component and using a screen printing process. However, it is necessary to form through holes in the first green sheets 2 and the second green sheets 3 in advance when forming the via-hole conductors 5.

Subsequently, the fourth step is carried out so that at least one of the first green sheets 2 and at least one of the second green sheets 3 are laminated one above another, thereby forming an unsintered laminated body 6 as shown in FIG. 1B.

It is preferable that at least one of the first and the second green sheet groups 2 and 3 are laminated to form an inner layer, and at least the other of the first and second green sheet groups 2 and 3 are laminated to form outer layers, with each inner layer and each outer layer being formed by at least one green sheet. In the present embodiment shown in the accompanying drawings, a plurality of (for example, three) second green sheets 3 are laminated to form an inner layer, while two groups of the first green sheets 2 (each group including three first green sheets 2) are arranged to form two outer layers, with the inner layer interposed therebetween.

After having been laminated in the above-described manner and thus forming the unsintered laminated body 6, the laminated body 6 is then pressed in the sheet laminating direction, thereby ensuring a tight adherence among the first and second green sheets 2 and 3.

Subsequently, the fifth step is carried out to sinter the unsintered laminated body 6, thereby obtaining a glass ceramic multilayer substrate 1 shown in FIG. 1C. Since the unsintered laminated body 6 is sintered and since such a laminated body 6 is formed by laminating together the first and second green sheets 2 and 3 exhibiting different sintering shrinkage behaviors, it is possible to obtain the same effect as provided by the technique disclosed in the above-discussed Japanese Unexamined Patent Application Publication No. 6-97656, thus effectively inhibiting a shrinkage in the plane direction of the laminated body 6.

The sintering process is performed in accordance with a predetermined sintering profile which causes the laminated body to reach the highest sintering temperature through a temperature rising process having an appropriate temperature rising speed. If the first green sheets 2 have a sintering temperature which is lower than that of the second green sheets 3, only the first green sheets 2 will be sintered during a sintering process using a relatively low sintering temperature corresponding to the sintering temperature of the first green sheets 2, thereby forming first sintered layers 7. Indeed, when the first green sheets 2 become first sintered layers 7, shrinkage will occur on the first green sheets 2, but the second green sheets 3 will be kept in an unsintered state and will thus suffer from almost no shrinkage. This is because the temperature at this step is lower than the sintering temperature of the second green sheets 3. As a result, an arresting action from the second green sheets 3 during the process for converting the first green sheets 2 to the first sintered layers 7, can provide an effect that shrinkage occurs only in the thickness direction of the laminated body and there is almost no shrinkage in the plane direction thereof.

Then, when the temperature arrives at the sintering temperature of the second green sheets 3, the second green sheets 3 will become a second sintered layer 8. Similarly, although shrinkage will occur during the process of converting the second green sheets 3 to the second sintered layer 8, such a shrinkage occurs only in the thickness direction of the laminated body, with almost no shrinkage occurring in the plane direction thereof. All this is due to a fact that there is an arresting action from the first sintered layers 7, and such an arresting action is acting on the second green sheets 3.

In this way, the unsintered laminated body 6 can be sintered under conditions in which its shrinkage in the plane direction thereof is inhibited, thereby obtaining a glass ceramic multilayer substrate 1 having a sufficient flatness.

In the above-described method for manufacturing a glass ceramic multilayer substrate 1, the present invention requires that the following conditions be observed with the sintering shrinkage behavior or the temperature rising speeds of the first and second green sheets 2 and 3.

Namely, if the shrinkage starting temperatures (° C.) of the first and second green sheets 2 and 3 are TSa and TSb, and if the sintering process ending temperatures (° C.) (which is when a shrinkage is 90% of a predetermined shrinking amount) of the first and second green sheets 2 and 3 are TFa and TFb, and the temperature rising speed is X° C./min, either $$(TFa+3X)<TSb$$

or $$(TFb+3X)<TSa.$$

After the unsintered laminated body 6 has exceeded the lower one of the respective glass transition temperatures of the first and second glass powders during the fifth step in the method of the present invention, the unsintered laminated body is caused to reach the highest sintering temperature through a temperature rising process having a temperature rising speed of greater than about 1° C./min, thereby effecting a desired sintering treatment in accordance with a predetermined sintering profile.

With the use of the conditions represented by the equation (TFa+3X)<TSb or (TFb+3X)<TSa, it is still possible to inhibit the shrinking ratio during the sintering process to within 10% in the plane direction of the unsintered laminated body 6, even if the temperature rising speed is higher than 1° C./min. The reason for this may be explained as follows.

Figure 2:
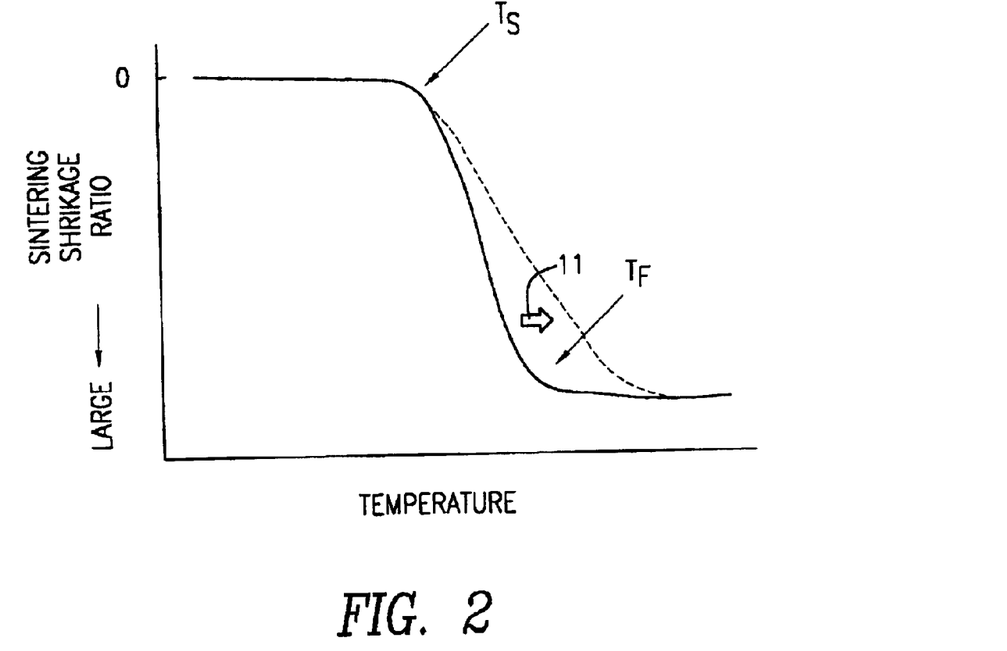
FIG. 2 is a graph showing a sintering shrinkage behavior of a green sheet containing a glass powder and a ceramic powder.

FIG. 2 is a graph showing the sintering shrinkage behavior of a specific green sheet. The graph shows the shrinkage starting temperature TS and sintering process ending temperature TF (i.e., when a shrinkage is 90% of a predetermined shrinking amount). TS and TF are those measured by using Dilatometer 5000 (manufactured by Japan Physical and Chemical Research Institute) with a temperature rising speed at 1° C./min.

The sintering process starting temperature TS is a parameter which will be affected by the temperature rising speed. Higher temperature rising speed will cause the sintering process starting temperature to become higher (as shown by an arrow 11), exhibiting a sintering shrinkage behavior represented by the dotted line. On the other hand, the sintering process ending temperature TF is a parameter corresponding to the softening point (a physical property) of the glass and will not be affected by the temperature rising speed.

In the present embodiment, theory allows one to believe that as long as it is possible to satisfy the equation TFa<TSb or TFb<TSa, it will be possible to inhibit to a minimum value the shrinkage caused due to the sintering treatment in the plane direction of a laminated body 6 formed by laminating together the first and second green sheets 2 and 3.

Even when TFa<TSb but the corresponding temperature difference is very small, or even when TFb<TSa but the corresponding temperature difference is very small, before one of the first green sheet group 2 and the second green sheet group 3 arrives at 90% of a predetermined shrinking amount, the other of the first green sheet group 2 and the second green sheet group 3 will begin to shrink if temperature rising speed is larger than 1° C./min. For this reason, it will become impossible to inhibit shrinkage in the plane direction within a value of 10%. The reason for the above phenomenon will be described in more detail with reference to FIG. 3.

Figure 3:
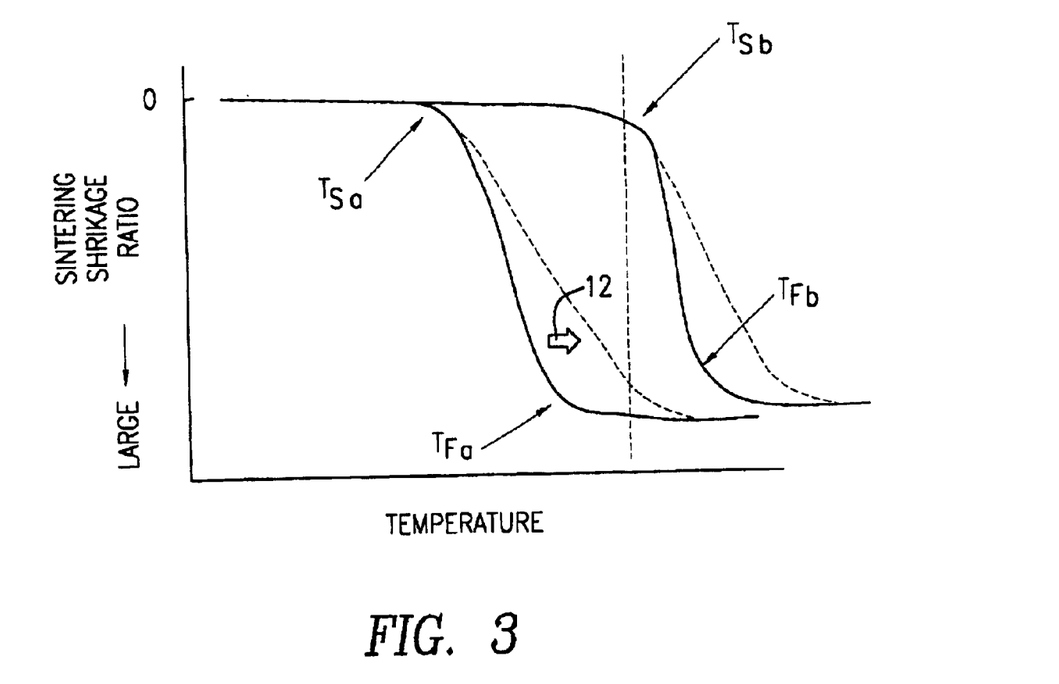
FIG. 3 is a graph corresponding to the graph in FIG. 2, showing a relationship between different sintering shrinkage behaviors of the first and second green sheets 2 and 3 prepared in an embodiment of the present invention.

FIG. 3 is a graph showing that TSa and TFa of the first green sheets 2 are all lower than TSb and TFb of the second green sheets 3. In FIG. 3, solid lines are used to represent sintering shrinkage behaviors when the temperature rising speed is 1° C./min while dotted lines are used to represent sintering shrinkage behaviors when the temperature rising speed is larger than 1° C./min.

FIG. 3 shows that when the temperature rising speed is 1° C./min, a temperature rising speed larger than 1° C./min will cause the solid curve (representing a sintering shrinkage behavior of the first green sheets 2) to shift in a direction shown by an arrow 12, even if TFa<TSb, so as to become the dotted line (also representing a sintering shrinkage behavior of the first green sheets 2), thus causing TFa to rise. As a result, prior to TFa TSb and before the first green sheets 2 arrive at 90% of a predetermined shrinking amount, the second green sheets 3 will possibly begin to shrink.

The materials forming the first and second green sheets 2 and 3 are designed such that it is possible to sufficiently ensure (TFa+3X)<TSb in order that the difference between TFa (° C.) and TSb (° C.) will become larger than 3X° C. (even under the above-described conditions). In this way, it is possible to inhibit a shrinking ratio in the plane direction of the unsintered laminated body 6 so that it may be controlled at 10% or lower irrespective of the temperature rising speed during the sintering process.

Here, TFa is the temperature when a shrinking amount of the first green sheets 2 arrives at 90%, which is a shrinking amount at the end of the sintering process. On the other hand, TSb is a shrinkage starting temperature of the second green sheets 3.

When the TSa and TFa of the first green sheets 2 are respectively higher than TSb and TFb of the second green sheets 2, it is possible to inhibit the shrinking ratio in the plane direction of the unsintered laminated body 6 so that it may be controlled at 10% or lower irrespective of a temperature rising speed during the sintering process if the materials forming the first and second green sheets 2 and 3 are designed such that it is possible to sufficiently ensure (TFb+3X)<TSa.

In view of the above, it is usually necessary to carry out in advance at least once the following preparation process when the glass ceramic multilayer substrate 1 is to be manufactured in an industrial scale.

Namely, the preparation process comprises preparing first test green sheets each containing a first glass powder and a first ceramic powder as its solid components; preparing second test green sheets each containing a second glass powder and a second ceramic powder as its solid components and capable of exhibiting a sintering shrinkage behavior different from that of the first test green sheets.

After these steps have been carried out, the preparation process further requires measuring the shrinking amount of each of the first and second test green sheets while sintering in accordance with a predetermined sintering profile so as to cause the green sheets to reach the highest sintering temperature through a temperature rising process having a temperature rising speed of 1C/min; determining the shrinkage starting temperatures TSa (° C.) and TSb (° C.) during the sintering process, and also determining sintering process ending temperatures TFa (° C.) and TFb (° C.), i.e., when the shrinking amount is 90%.

If the first and second test green sheets satisfy the equation (TFa+3X)<TSb or (TFb+3X)<TSa, the first green sheets 2 and second green sheets 3 can be used in industrial production using the above-described steps and produce the desired glass ceramic multilayer substrate 1.

Because the conductor films 4 are to be attached to the glass ceramic multilayer substrate 1, there is a possibility that the mounting operation yield will decrease because the conductor films 4 on the outer surface of the substrate will sometimes deviate from their correct positions. However, if the sintering shrinkage ratio is inhibited at about 10% or lower, this undesired possibility can be avoided by simply increasing the surface area of the conductor films. Preferably, the sintering shrinkage ratio is inhibited at about 5% or lower, more preferably about 2% or lower. In order to ensure such a low sintering shrinkage ratio, it is necessary to properly select the type and mixing ratio of the solid components to be contained in the first and second green sheets 2 and 3 so that before one of the first and second green sheet groups 2 and 3 arrives at a sintering shrinkage ratio which is about 5% or lower, or about 2% or lower, the other of the first and second green sheet groups 2 and 3 will begin to shrink.

As to a temperature rising speed X° C./min with respect to (TFa+3X)<TSb or (TFb+3X)<TSa, the object of the present invention can be achieved if a temperature rising speed is X° C./min, based on the principle that the temperature rising speed acts between temperature TFa or TFb (when one of the first and second green sheet groups 2 and 3 arrive at 90% of a predetermined shrinking amount) and temperature TSb or TSa (which is a shrinkage starting temperature of the other of the first and second green sheet groups). Therefore, the temperature rising speed in any of other temperature rising processes can be optionally set in accordance with characteristics of the unsintered laminated body 6.

Preferably, the thermal expansion coefficient difference between the first green sheets 2 and the second green sheets 3 in a range from a temperature of 20° C. to the lower one of the respective glass transition points of the first and second glass powders is small. In practice, such a thermal expansion coefficient difference is preferred to be within ±0.5×10$^{-6}$/° C., and more preferably within ±0.1×10$^{-6}$/° C.

By selecting in the above manner an appropriate thermal expansion coefficient difference between the first green sheets 2 and the second green sheets 3, it is possible to improve the reliability of the glass ceramic multilayer substrate 1. On the other hand, if the thermal expansion coefficient difference is larger than ±0.5×10$^{-6}$/° C., there will be a relatively large stress occurring between the first sintered layers 7 formed by sintering the first green sheets 2 and the second sintered layer 8 formed by sintering the second green sheets 3, undesirably causing some small cracks. In fact, such kind of small cracks will remarkably reduce the strength of thus produced glass ceramic multilayer substrate.

EXAMPLE

In the following, the present invention will be described by giving an example.

BaO—MgO—SiO$_2$—B$_2$—O$_3$ glass powder and alumina powder were mixed together using a mixing ratio of 80:20, thereby forming a powder mixture. Then, an acryl resin, a xylene resin, butanol, a plasticizer and a dispersing agent were mixed into the powder mixture, thereby forming a slurry. Subsequently, the doctor blade method was used to prepare first green sheets 2 shown in FIG. 1A.

MgO—ZnO—SiO$_2$—B$_2$O$_3$ glass powder and BaO—Sm$_2$O$_3$—SiO$_2$—TiO$_2$ ceramic powder were mixed together using a mixing ratio of 30:70, thereby forming a powder mixture. Then, second green sheets 3 shown in FIG. 1A were obtained in the same method as used for preparing the first green sheets 2.

The first and second green sheets 2 and 3 were measured to detect their shrinkage starting temperatures TSa and TSb and sintering process ending temperatures TFa and TFb (when a shrinkage is 90% of a predetermined shrinking amount), using Dilatometer 5000 (manufactured by Japan Physical and Chemical Research Institute) with a temperature rising speed at 1° C./min. It was found that the first green sheets 2 had TSa of 718° C. and TFa of 771° C., and that the second green sheets had TSb of 816° C. and TFb of 862° C. Therefore, the difference between TFa of the first green sheets 2 and TSb of the second green sheets 3 was 45° C.

Then, an electrically conductive paste containing silver as its electrically conductive component was printed on to the first and second green sheets 2 and 3, thereby forming conductor films 4 and via-hole conductors 5 shown in FIG. 1A.

Afterwards, as shown in FIG. 1B, three second green sheets 3 were laminated one above another, and three first green sheets 2 were laminated on either side of the laminated second green sheets 3, thereby obtaining an unsintered laminated body 6.

The plane size of each of the laminated green sheets 2 and 3 is 40 mm×40 mm.

Subsequently, the unsintered laminated body 6 was pressed by a pressure of 100 kgf/cm$^2$ for about 30 seconds, at a temperature of 100° C. Afterwards, the laminated body 6 was sintered in the surrounding atmosphere, in accordance with a predetermined sintering profile in which the laminated body was subjected to a temperature rising process whose temperature rising speed was changed gradually from 2° C./min to 20° C./min (as shown in Table 1), and then kept at the highest temperature of 900° C. for 30 minutes.

Table 1 shows evaluation results on 3X, sintering shrinkage ratio and warpage.

TABLE 1

|  | Temperature rising speed (X) (° C./min.) | 3X (° C.) | Sintering shrinkage ratio (%) | Warpage |
|---|---|---|---|---|
| Example 1 | 2 | 6 | 1.1 | none |
| Example 2 | 4 | 12 | 1.2 | none |
| Example 3 | 6 | 18 | 1.0 | none |
| Example 4 | 8 | 24 | 1.0 | none |
| Example 5 | 10 | 30 | 4.1 | none |
| Example 6 | 12 | 36 | 6.2 | none |
| Example 7 | 14 | 42 | 8.1 | none |
| Comparative Ex. 1 | 16 | 48 | 10.9 | none |
| Comparative Ex. 2 | 18 | 54 | 12.5 | none |
| Comparative Ex. 3 | 20 | 60 | 14.2 | none |

As shown in Table 1, no warpage occurred in Examples 1 to 7 or Comparative Examples 1 to 3. However, upon comparing Examples 1 to 7 with Comparative Examples 1 to 3, it is seen possible to inhibit the sintering shrinkage ratio at 10% or lower in Examples 1 to 7 (having a relatively small 3X as compared to the 45° C. difference between TFa of the first green sheets 2 and TSb of the second green sheets 3), while the sintering shrinkage ratio is larger than 10% in Comparative Examples 1 to 3 (having a relatively large 3X as compared with 45° C.).

According to the present invention, after the unsintered laminated body has exceeded the lower one of the respective glass transition temperatures of the first and second glass powders contained respectively in the first and second green sheets during a process of sintering an unsintered laminated body formed by laminating together first and second green sheets having different sintering shrinkage behaviors, the unsintered laminated body is caused to reach the highest sintering temperature through a temperature rising process having a temperature rising speed larger than 1° C./min, thereby effecting a desired sintering treatment in accordance with a predetermined sintering profile. When the shrinkage starting temperatures (° C.) of the first and second green sheets are TSa and TSb, the sintering process ending temperatures (° C.) (when shrinkage is 90% of a predetermined shrinking amount) of the first and second green sheets are TFa and TFb, and the temperature rising speed is X° C./min, a condition can be set which satisfies an equation (TFa+3X)<TSb or (TFb+3X)<TSa. In this way, it is possible to inhibit the shrinking ratio during the sintering process in the plane direction of the laminated body at 10% or lower, without having to provide a sintering band at a predetermined temperature in an intermediate temperature range located between the shrinkage ending temperature of one of the first and second green sheet groups and the shrinkage starting temperature of the other of the first and second green sheet groups, thereby producing the desired glass ceramic multilayer substrate.

As a result, it is possible for the sintering process to be completed in a shortened time period and allow the manufacturing process to be carried out at a reduced cost. Further, it is possible to provide a high precision in size to the conductor films and the via-hole conductors provided in the glass ceramic multilayer substrate.

Furthermore, according to the present invention, a thermal expansion coefficient difference between the first green sheets and the second green sheets is an average thermal expansion coefficient acting in a range from a temperature of 20° C. to a lower one of the respective glass transition points of the first and second glass powders. If such a thermal expansion coefficient difference is set within $\pm 0.5\times 10^{-6}$/° C., it is possible to inhibit the occurrence of small cracks which will otherwise be caused due to the thermal expansion coefficient difference, thereby obtaining an improved reliability for the glass ceramic multilayer substrate.

Moreover, if one of the first and second green sheet groups is used to form an inner layer and the other of the first and second green sheet groups are used to form outer layers (with each inner layer and each outer layer being formed by one or more than one material layer) in a process of forming an unsintered laminated body according to the present invention, it is possible to inhibit the occurrence of warpage during the sintering process. Therefore, it becomes easy to produce a glass ceramic multilayer substrate having a sufficient flatness.

Various changes and modifications can be made in the process and products of this invention without departing from the spirit and scope thereof. The embodiments set forth herein were for the purpose of illustrating the invention and not to limit it.

What is claimed is:

1. A method of manufacturing a glass ceramic multilayer substrate, comprising:

providing first green sheets each comprising a first glass powder having a glass transition temperature and a first ceramic powder as its solid components, the shrinkage starting temperature (° C.) of the first green sheets being TSa and the sintering process ending temperature (° C.) when the shrinkage is 90% of a predetermined shrinking amount being TFa;

providing second green sheets each comprising a second glass powder having a glass transition temperature and a second ceramic powder as its solid components and exhibiting a sintering shrinkage behavior different from that of the first green sheets, the shrinkage starting temperature (° C.) of the second green sheets being TSb and the sintering process ending temperature (° C.) when the shrinkage is 90% of a predetermined shrinking amount being TFb;

forming at least one conductor film or via-hole conductor on or in at least one first green sheet or second green sheet;

laminating at least one first green sheet and at least one second green sheet together to form an unsintered laminated body; and sintering the unsintered laminated body by heating the unsintered laminated body to a temperature which is higher than the lower one of the respective glass transition temperatures of the first and second glass powders, and then causing the unsintered laminated body to arrive at the highest sintering temperature through a temperature rising process having a temperature rising speed of greater than about 1° C./min;

wherein the composition of the green sheets is such that (TFa+3X)<TSb or (TFb+3X)<TSa where X is said sintering temperature rising speed in °C./min.

2. The method according to claim 1, wherein the first green sheets and the second green sheets have a thermal expansion coefficient difference in a temperature range from 20° C. to the lower one of the respective glass transition temperature of the first and second glass powders, within about $\pm 0.5\times 10^{-6}$/° C.

3. The method according to claim 1, wherein the first and second green sheets satisfy at least one of the following three conditions: (A) the first glass powder has a composition different from that of the second glass powder; (B) the first ceramic powder has a composition different from that of the second ceramic powder; and (C) the mixing ratio of the first glass powder to the first ceramic powder in the first green sheets is different from a mixing ratio of the second glass powder to the second ceramic powder in the second green sheets.

4. A method according to claim 1, wherein at least one of the first and second green sheet group is disposed as an inner layer of the unsintered laminate, and the other of the first and second green sheet groups is disposed so as to form outer layers of the unsintered laminate, with each inner layer and each outer layer being formed by at least one green sheet.

5. The method according to claim 1, wherein the first glass powder comprises $BaO-MgO-SiO_2-B_2O_3$ glass, the first ceramic powder is at least one substance selected from the group consisting of alumina, spinel and zirconia, and the mixing ratio of the first glass powder to the first ceramic powder in the first green sheets is about 40:60 to less than 100:0 by weight.

6. The method according to claim 5, wherein the first glass power further comprises as an additive at least one substance selected from the group consisting of copper oxide, $Al_2O_3$, ZnO, $TiO_2$, $ZrO_2$ and $R_2O$, where R is an alkali metal.

7. The method according to claim 1, wherein the second glass powder comprises $MgO-ZnO-SiO_2-B_2O_3$ glass, the second ceramic powder comprises $BaO-Re_2O_3-Nd_2O_3-TiO_2$ where Re is a rare earth element, and the mixing ratio of the second glass powder to the second ceramic powder is about 10:90 to 40:60 by weight.

8. A method according to claim 7, wherein the second glass power further comprises an additive which is at least one substance selected from the group consisting of copper oxide, BaO, CaO, $Al_2O_3$ and $R_2O$ where R is an alkali metal.

9. The method according to claim 1, wherein the laminated body is such that it has a sintering shrinkage ratio (%) within about 10%, where the shrinkage ratio is {(size before sintering)−(size after sintering)}×100/(size before sintering).

10. The method according to claim 9, wherein the first and second green sheets satisfy at least one of the following three conditions: (A) the first glass powder has a composition different from that of the second glass powder; (B) the first ceramic powder has a composition different from that of the second ceramic powder; and (C)the mixing ratio of the first glass powder to the first ceramic powder in the first green sheets is different from a mixing ratio of the second glass powder to the second ceramic powder in the second green sheets, and wherein said shrinkage ratio is within about 5%.

11. The method according to claim 10, wherein the first glass powder comprises $BaO-MgO-SiO_2-B_2O_3$ glass, the first ceramic powder is at least one substance selected from the group consisting of alumina, spinel and zirconia, and the mixing ratio of the first glass powder to the first ceramic powder in the first green sheets is about 40:60 to less than 100:0 by weight; wherein the second glass powder comprises $MgO-ZnO-SiO_2-B_2O_3$ glass, the second ceramic powder comprises $BaO-Re_2O_3-Nd_2O_3-TiO_2$ where Re is a rare earth element, and the mixing ratio of the second glass powder to the second ceramic powder is about 10:90 to 40:60 by weight; and, wherein said shrinkage ratio is within about 2%.

12. The method according to claim 11, wherein the first glass power further comprises at least one substance selected from the group consisting of copper oxide, $Al_2O_3$, ZnO, $TiO_2$, $ZrO_2$ and $R_2O$, the second glass power further comprises at least one substance selected from the group consisting of copper oxide, BaO, CaO, $Al_2O_3$ and $R_2O$, where R is an alkali metal; and wherein the first green sheets and the second green sheets have a thermal expansion coefficient difference in a temperature range from 20° C. to the lower one of the respective glass transition temperature of the first and second glass powders, within about $\pm 0.5 \times 10^{-6}$/° C.

13. The method according to claim 1, wherein the laminated body is such that it has a sintering shrinkage ratio within about 5%.

14. The method according to claim 1, wherein the laminated body is such that it has a sintering shrinkage ratio within about 2%.

15. A method of manufacturing a glass ceramic multilayer substrate according to claim 1, further comprising selecting the first and second green sheets by a process which comprises:

providing proposed first and second green sheets;

sintering the proposed first and second green sheets in accordance with the sintering profile to be used in the manufacturing method and determining the shrinking amounts of the first and second test green sheets, the shrinkage starting temperatures TSa (° C.) and TSb (° C.) and the sintering process ending temperatures TFa (° C.) and TFb (° C.), and selecting first and second green sheets which satisfy the equation:

$$(TFa+3X) < TSb \text{ or } (TFb+3X) < TSa.$$

16. The method according to claim 15, wherein the proposed first and second green sheets have a thermal expansion coefficient difference in a temperature range from 20° C. to the lower one of the respective glass transition temperature of the first and second glass powders, which is within about $10.5 \times 10^{-6}$/° C.

17. The method according to claim 15, wherein the proposed first and second green sheets satisfy at least one of the following three conditions: (A) the first glass powder has a composition different from that of the second glass powder; (B) the first ceramic powder has a composition different from that of the second ceramic powder; and (C) the mixing ratio of the first glass powder to the first ceramic powder in the first green sheets is different from a mixing ratio of the second glass powder to the second ceramic powder in the second green sheets.

18. The method according to claim 16, wherein the first glass powder comprises BaO—MgO—$SiO_2$—$B_2O_3$ glass, the first ceramic powder is at least one substance selected from the group consisting of alumina, spinel and zirconia, and the mixing ratio of the first glass powder to the first ceramic powder in the first green sheets is about 40:60 to 100:0 by weight, and wherein the second glass powder comprises MgO—ZnO—$SiO_2$—$B_2O_3$ glass, the second ceramic powder comprises BaO—$Re_2O_3$—$Nd_2O_3$—$TiO_2$ where Re is a rare earth element, and the mixing ratio of the second glass powder to the second ceramic powder is about 10:90 to 40:60 by weight.

* * * * *